United States Patent [19]

Nutz

[11] 4,161,703
[45] Jul. 17, 1979

[54] SCHMITT TRIGGER SQUARE WAVE OSCILLATOR

[75] Inventor: Karl-Diether Nutz, Oedheim, Fed. Rep. of Germany

[73] Assignee: Licentia Patent-Verwaltungs-G.m.b.H., Frankfurt, Fed. Rep. of Germany

[21] Appl. No.: 886,395

[22] Filed: Mar. 14, 1978

[30] Foreign Application Priority Data

Mar. 22, 1977 [DE] Fed. Rep. of Germany ....... 2712369

[51] Int. Cl.² .................. H03K 3/295; H03K 3/35
[52] U.S. Cl. .................................. 331/111; 331/153; 331/175
[58] Field of Search ........... 331/111, 143, 153, 108 C, 331/108 D, 175, 176

[56] References Cited

U.S. PATENT DOCUMENTS

| | | | |
|---|---|---|---|
| 3,432,772 | 3/1969 | Johnsen et al. | 331/143 X |
| 3,694,772 | 9/1972 | Sordello | 331/111 |
| 3,886,485 | 5/1975 | Takahashi | 331/111 |
| 3,924,202 | 12/1975 | Craft | 331/111 |

*Primary Examiner*—Siegfried H. Grimm
*Attorney, Agent, or Firm*—Spencer & Kaye

[57] ABSTRACT

An oscillator for producing rectangular pulses comprises a Schmitt trigger controlled by an R.C. element connected in series, a constant current source for charging up the capacitor and a current image circuit for ensuring that the discharge current of the capacitor is consistent with its charging current.

7 Claims, 2 Drawing Figures

SCHMITT TRIGGER SQUARE WAVE OSCILLATOR

BACKGROUND OF THE INVENTION

The invention relates to an oscillator for producing rectangular pulses with a Schmitt trigger. It is known how a rectangular shaped pulse voltage can be produced from a sinusoidal input voltage for example, with the aid of a Schmitt trigger circuit. A Schmitt trigger circuit changes from its starting condition when a certain triggering level is reached and then goes back into the starting condition when a cut-off level is reached.

Often a clock pulse generator is necessary for integrated digital circuits and its frequency can be tuned in a certain range around the basic frequency $f_0$. The variation range is $\pm 30\%$ for example. Furthermore the integrated circuit should be constructed as far as possible so that it only has a single external connection to which the time-determining external components can be connected.

SUMMARY OF THE INVENTION

It is an object of the invention to provide a circuit of this type which can be integrated into bipolar technology and the output frequency of which can be tuned in a certain range. Furthermore, the circuit should be as independent as possible of fluctuations in temperature and fluctuations in the supply voltage.

According to the invention there is provided an oscillator for producing rectangular pulses comprising a Schmitt trigger, an RC element connected in series for controlling said Schmitt trigger, a constant current source for supplying current to charge up the capacitor of said RC element and a current image, or mirror, circuit for ensuring that the discharge current of said capacitor is consistent with the charging current of said capacitor.

Further according to the invention, there is provided an oscillator for producing rectangular pulses with a Schmitt trigger, characterised in that the Schmitt trigger is controlled by an RC element connected in series; that a constant current source is provided which delivers the current required for charging up the capacitor; and that a current image circuit is present which ensures that the discharge current of the capacitor is consistent with the charging current.

BRIEF DESCRIPTION OF THE DRAWINGS

The invention will now be described in greater detail, by way of example, with reference to the drawings, in which.

DESCRIPTION OF THE PREFERRED EMBODIMENTS

In a preferred embodiment of the invention it is proposed, in an oscillator of the type described at the outset, that the Schmitt trigger be controlled via an RC element connected in series; that a constant current source be provided which supplies the current $I_K$ necessary for charging up the capacitor and that a current image circuit be present which ensures that the discharge current of the capacitor agrees with the charging current.

The output frequency of the oscillator is changed by variation of the resistor in the RC element. The current supply of the oscillator circuit is undertaken preferably via a first current image circuit which delivers the constant current to the RC element on the one hand and on the other hand supplies the Schmitt trigger with a constant current. Furthermore this first current image circuit also supplies a further circuit part, which serves to produce a reference voltage determining the switching voltage of the Schmitt trigger, with a further constant current.

If the Schmitt trigger reaches an input voltage of a defined magnitude then the output potential of the Schmitt trigger is changed. This is achieved by blocking one of the two transistors of the Schmitt trigger while the other becomes conductive. This transistor which becomes conductive triggers a second current image circuit through which a current is withdrawn from the RC element, said current being twice as large as the current supplied by the first current image circuit so that a discharge current arises, owing to the addition of the two currents, and this discharge current corresponds to the charging current.

Figure 1:
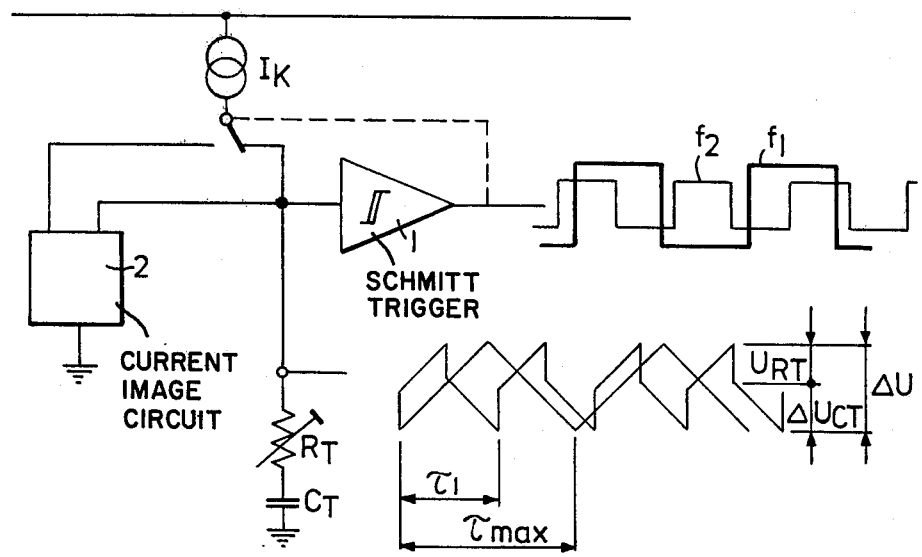
FIG. 1 shows a general circuit for an oscillator according to the invention.
Figure 2:
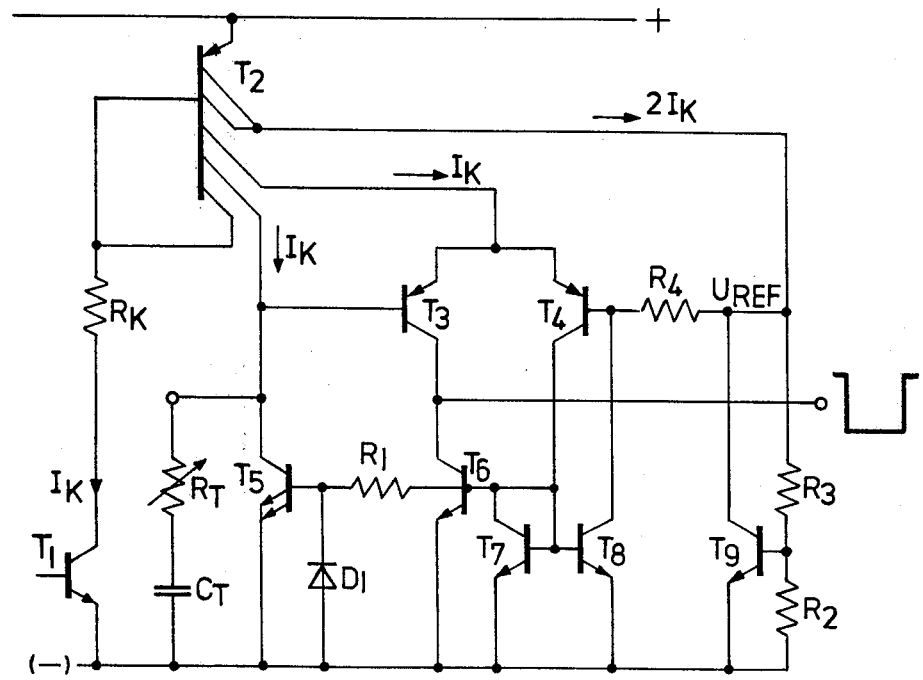
FIG. 2 shows a more detailed circuit diagram of a circuit suitable embodiment of the circuit shown in FIG. 1.

Referring to the drawings, FIG. 1 shows a general circuit of an oscillator in accordance with the invention. A particularly advantageous refinement is shown in FIG. 2 which is particularly suitable for realisation in bipolar technology within the framework of an integrated semiconductor circuit. This oscillator shown in FIG. 2 receives its switching on signal from an assembly of the integrated circuit, connected in front of it for example, and passes the pulse-shaped output signal of a certain frequency on for further processing to a logic circuit connected thereafter.

In accordance with FIG. 1, a series-connected RC element comprising the capacitor $C_T$ and the resistor $R_T$ is connected to a constant current source $I_K$. The input electrode of the Schmitt trigger 1 is connected to the RC element, a rectangular shaped pulse voltage being formed at its output. Furthermore, a current image circuit 2 is connected to the RC element, the constant current source being switched over in the discharge phase of the capacitor $C_T$ to the current image circuit 2.

With a short-circuited resistor $R_T$ a purely triangular voltage is present at the capacitor $C_T$ as is shown in FIG. 1. The capacitor $C_T$ is initially charged up from the constant current source $I_K$. When the upper threshold voltage of the Schmitt trigger 1 is achieved the constant current source is switched over to the current image circuit 2 via the output of the Schmitt trigger, the current image circuit ensuring that the capacitor is discharged by the current delivered by the constant current source. This discharge process is continued until the lower threshold voltage of the Schmitt trigger is achieved at the input of the Schmitt trigger 1. A rectangular voltage of the frequency $f_1$ is present at the output of the Schmitt trigger 1 at a scanning ratio 1:1 and a period duration $\tau = \tau_{max}$, whereby $\tau_{max}$ corresponds to the period duration of the triangular input voltage.

When the resistor $R_T$ presents a finite resistance in series with the capacitor $C_T$, then a voltage drop of the magnitude $I_K \cdot R_T$ appears across this resistor. The resultant voltage curve of the input voltage at the Schmitt trigger is similarly shown in FIG. 1. Initially, when the constant current source is switched on, the voltage at the input of the Schmitt trigger jumps to the value $U_{RT}=I_K \cdot R_T$. Then the charging up phase of the capacitor $C_T$ begins whereby the input voltage at the Schmitt trigger rises smoothly. When the upper threshold voltage of the Schmitt trigger is achieved, the output potential of the Schmitt trigger is switched over and thus the constant current source switches over to the current image circuit. As a result, the capacitor $C_T$ can discharge itself. Owing to the voltage drop across the resistor $R_T$ the input voltage of the Schmitt trigger initially drops in a jump by the value $U_{RT}$ and then drops to the lower threshold voltage smoothly because of discharge of the capacitor with the current $I_K$. The voltage rise caused by charging and discharging the capacitor is designated with the value $\Delta U_{CT}$.

As can be seen from FIG. 1 the period of the waveform of the input voltage to Schmitt trigger 1 is shortened to the value $\tau_1$ by insertion of the finite resistance value. As a result, the pulse frequency also changes at the output of the Schmitt trigger and now has the higher value $f_2$.

The larger the resistance of resistor $R_T$ becomes, the larger is the voltage drop $U_{RT}$ and $\Delta U_{CT}$ the smaller. Since the charge reversal current $I_K$ remains constant, a fairly small $\Delta U_{CT}$ does mean, however, a shortening of the period duration $\tau$, which is thus a function of $C_T$ and $R_T$.

An advantageous embodiment of the basic circuit which has been described in outline is shown in FIG. 2. A multicollector transistor $T_2$ is triggered via a triggering transistor $T_1$. A resistor $R_K$ by which the constant current $I_K$ is set is located in the collector supply line of the transistor $T_1$ which is connected at the same time to one of the collectors of the transistor $T_2$. A further collector of the transistor $T_2$ is connected to the series circuit comprising the resistor $R_T$ and the capacitor $C_T$. The emitter-collector path of a transistor $T_5$ is connected in parallel to the RC element. A further collector of the transistor $T_2$ is connected to the Schmitt trigger circuit made up of the transistors $T_3$ and $T_4$, whereby the two emitter electrodes of the two transistors are connected direct to the collector electrode of the transistor $T_2$. The base electrode of the transistor $T_3$ is connected to the RC element. The output signal of the Schmitt trigger is derived at the collector of the transistor $T_3$. The resistor $R_4$ is connected to the base electrode of the transistor $T_4$, which resistor is connected on the other hand to the circuit for producing a reference voltage. This circuit for producing the reference voltage comprises a voltage divider composed of the two resistors $R_2$ and $R_3$ connected in series and the transistor $T_9$ which has its emitter-collector path being connected in parallel to the voltage divider. The base electrode of the transistor $T_9$ is connected to the connection between the two resistors $R_2$ and $R_3$. This circuit for producing the reference voltage is connected to a further collector of the transistor $T_2$ whereby this collector is designed so that a current flows through it which is twice as large as the constant current $I_K$ passed to the Schmitt trigger and the RC element.

The collectors of transistor $T_2$ connected to the RC circuit and to the emitters of transistors $T_3$ and $T_4$ define the first current image circuit.

The second current image circuit comprises the transistors $T_5$, $T_6$, $T_7$ and $T_8$. A delay element comprising a resistor $R_1$ and the diode $D_1$ is connected between the base electrode of the transistor $T_5$ and the base electrodes of the transistors $T_6$, $T_7$ and $T_8$. The two components $R_1$ and $D_1$ act as an RC element. The transistor $T_6$ is connected into the collector supply line of the transistor $T_3$ whereby the two collectors of the complementary transistors $T_3$ and $T_6$ are connected together. The base electrode of the transistor $T_6$ is connected to the collector electrode of the transistor $T_7$ and at the same time to the collector electrode of the transistor $T_4$ and the base electrodes of the transistors $T_7$ and $T_8$. The collector electrode of the transistor $T_8$ is connected to the resistor $R_4$ and at the same time to the base electrode of the transistor $T_4$. The emitter electrodes of the transistors $T_5$, $T_6$, $T_7$, $T_8$ and $T_9$ are connected to one pole of the supply voltage. The transistors $T_2$, $T_3$ and $T_4$ are pnp transistors, for example, while the transistors $T_1$, $T_5$, $T_6$, $T_7$, $T_8$ and $T_9$ can then be npn transistors.

The circuit functions as follows: The multi-collector transistor $T_2$ connected as a first current image circuit is triggered by a triggering signal at the control electrode, or base, of the transistor $T_1$. The three collectors of transistor $T_2$, which are connected respectively to the RC circuit $R_T C_T$, the collector path of the triggering transistor $T_1$ and to the Schmitt trigger are of the same size, for example, so that the same constant current $I_K$ must flow through each of these collector paths. The collector of the transistor $T_2$ which is connected to the reference voltage circuit may be twice as large as the remaining collectors for example so that the current $2 \times I_K$ flows away via this collector. The reference voltage circuit made up of the resistors $R_2$ and $R_3$ and the transistor $T_9$ functions like a zener diode so that a voltage $U_{REF}$ is formed at the collector of $T_9$ which is substantially independent of the supply voltage. When transistor $T_8$ is blocked, this reference voltage is also present at the base electrode of the transistor $T_4$ and thus determines the upper threshold value of the Schmitt trigger.

If the capacitor $C_T$ is not charged and if the multi-collector transistor $T_2$ is triggered via the triggering transistor $T_1$, then the transistor $T_3$ of the Schmitt trigger is initially conductive since a base current can flow away to the RC element via the base electrode of this transistor. The current $I_K$ which flows away via the output line of the Schmitt trigger flows substantially through the transistor $T_3$. Initially the voltage jumps at the RC element to the value $I_K \cdot R_T$ and then rises smoothly until a voltage corresponding to the voltage at the base electrode of $T_4$ is present at the base electrode of the transistor $T_3$. Now the transistor $T_4$ becomes conductive and, as a result of the current flow through transistor $T_4$, the transistors $T_6$, $T_7$ and $T_8$ become conductive in turn. When transistor $T_8$ becomes conductive, a current $I_K$ flows across the resistor $R_4$ so that the voltage drop $I_K \cdot R_4$ appears substantially across the resistor $R_4$. The base potential of transistor $T_4$ is lowered by this voltage, which is the voltage $\Delta U$ determining the switching hysteresis of the Schmitt trigger. The transistors $T_6$, $T_7$ and $T_8$ are constructed completely identically in integrated circuit technology so that the identical constant current value $I_K$ flows through all three transistors. The transistor $T_8$ thus takes its constant current substantially from the current supplied to the reference voltage circuit while the constant current supplied to the Schmitt trigger flows through the transistor $T_7$. The constant current through the transistor $T_6$ is drawn through the output electrode of the Schmitt trigger.

The base current which flows through the transistors $T_6$, $T_7$ and $T_8$ is supplied at the same magnitude to the transistor $T_5$ too. Of course the delay element made up of the diode $D_1$ and the resistor $R_1$ is connected between the transistor $T_5$ and the transistor $T_6$. This delay element causes the transistor $T_5$ alone to be rendered conductive when the potential at the base electrode of the transistor $T_4$ has dropped noticeably. In this way the Schmitt trigger is prevented from beginning to oscillate.

The transistor $T_5$ is constructed similarly to the transistors $T_6$, $T_7$ and $T_8$ but it has twice the emitter area so that it acts like two parallel connected transistors. Twice the current as that through the transistors $T_6$, $T_7$ and $T_8$ must flow away through the transistor $T_5$. Thus as before the constant current $I_K$ is supplied to the RC element by the multi-collector transistor $T_2$, but the discharge current of the magnitude $2 \times I_K$ flows in the opposite direction so that the capacitor $C_T$ is now discharged by the current $I_K - 2 \times I_K = -I_K$. This discharge is continued until the voltage at the base electrode of the transistor $T_3$ reaches the value of the voltage applied to the base electrode of the transistor $T_4$. This is the lower threshold value of the Schmitt trigger at the same time, and when it is reached the transistor $T_3$ becomes conductive again and the transistor $T_4$ is blocked.

When the transistor $T_3$ is blocked, a low potential is applied to its collector and thus to the output of the Schmitt trigger, this potential jumping to a high value as soon as the transistor $T_3$ becomes conductive and the transistor $T_4$ is blocked.

The fact that the hysteresis of the Schmitt trigger is controlled by the transistor $T_8$ makes the circuit largely independent of differences in component parameter values from design values. The output frequency of the Schmitt trigger is largely independent of the magnitude of the constant current. With a low constant current the rising flank of the voltage at the capacitor is in fact flatter but at the same time the lower threshold value of the Schmitt trigger is raised since the voltage drop across the resistor $R_4$ is smaller. Thus by appropriate dimensioning of the resistance ratio $R_4/R_K$ the output frequency can be made largely independent of the magnitude of the constant current $I_K$.

When integrating the described circuit within the framework of a logical whole circuit, for example in a circuit for a light dimmer, the described frequency oscillator requires only a single separate connection to which the RC element can be connected externally. The resistor $R_T$ will be a potentiometer preferably in order to be able to undertake frequency changing or frequency tuning of the oscillator.

It will be understood that the above description of the present invention is susceptible to various modification changes and adaptations.

What is claimed is:

1. In an oscillator for producing a square wave output signal and including a Schmitt trigger circuit, a capacitor connected for controlling the operation of the Schmitt trigger circuit, a constant current source connected to supply the capacitor with charging current, and current control means connected for causing the discharge current from the capacitor to be consistent with the charging current thereto, the improvement wherein: said oscillator further comprises a variable resistor connected in series with said capacitor to form a series RC element therewith; and a current-driven reference voltage source connected to supply said Schmitt trigger circuit with a reference voltage which determines the switching voltage of said Schmitt trigger circuit; said constant current source comprises a first current mirror circuit connected for simultaneously supplying a constant charging current to said capacitor, a constant current to said Schmitt trigger circuit and a constant current to said reference voltage source; and said current control means comprise a second current mirror circuit including a transistor connected in parallel with said series RC element, said transistor being switchable into a conductive state in which it conducts a current in a direction to discharge said capacitor and having twice the amplitude of the constant charging current supplied to said capacitor by said first current mirror circuit, whereby superposition of the current conducted by said transistor and the constant charging current supplied to said capacitor by said first current mirror circuit results in a discharging current through said capacitor equal in amplitude to the charging current supplied to said capacitor by said first current mirror circuit.

2. An oscillator as defined in claim 1 wherein said Schmitt trigger circuit switches into a first predetermined operating state when the voltage across said series RC element reaches a first defined value, and said second current mirror circuit is connected to respond to switching of said Schmitt trigger circuit in a manner to switch said transistor into its said conductive state when said Schmitt trigger circuit switches into its said first predetermined state for causing the discharging current to flow through said capacitor.

3. An oscillator as defined in claim 2, and comprising a delay element connected between the control electrode of said transistor of said second current mirror circuit and the remaining part of said second current mirror circuit.

4. An oscillator as defined in claim 3 wherein said delay element comprises a second RC element and includes a diode providing the capacitance of said second RC element.

5. An oscillator as defined in claim 2 wherein the constant current supplied by said first current mirror circuit to said reference voltage source is larger than the constant current supplied to said capacitor so that a part of the larger constant current supplied to said reference voltage source controls the switching hysteresis of said Schmitt trigger circuit after it switches into its first predetermined state.

6. An oscillator as defined in claim 5 wherein the constant current supplied to said reference voltage source is twice as large as the charging current supplied to said capacitor.

7. An oscillator as defined in claim 2, wherein said first current mirror circuit comprises a multi-collector transistor providing constant currents corresponding to the areas of its collectors through its individual collectors.

* * * * *